United States Patent
Comard

(10) Patent No.: US 6,613,639 B1
(45) Date of Patent: Sep. 2, 2003

(54) FORMING A SEMICONDUCTOR ON IMPLANTED INSULATOR

(75) Inventor: Matthew J. Comard, Woodland Park, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/060,867

(22) Filed: Jan. 30, 2002

(51) Int. Cl.[7] .................... H01L 21/331; H01L 21/76
(52) U.S. Cl. .................... 438/311; 438/425; 438/443; 438/450
(58) Field of Search .................... 438/311, 450, 438/443–444, 439, 426, 425, 423, 149

(56) References Cited

U.S. PATENT DOCUMENTS

| | | | | |
|---|---|---|---|---|
| 5,413,953 A | * | 5/1995 | Chien et al. | 438/443 |
| 5,494,846 A | * | 2/1996 | Yamazaki | 438/407 |
| 5,789,305 A | * | 8/1998 | Peidous | 438/439 |
| 5,970,339 A | * | 10/1999 | Choi | 438/243 |
| 6,261,876 B1 | * | 7/2001 | Crowder et al. | 438/149 |

* cited by examiner

Primary Examiner—Carl Whitehead, Jr.
Assistant Examiner—Thanh Nguyen
(74) Attorney, Agent, or Firm—Luedeka, Neely & Graham

(57) ABSTRACT

A method of forming a semiconductor on insulator structure in a monolithic semiconducting substrate with a bulk semiconductor structure. A first portion of a surface of the monolithic semiconducting substrate is recessed without effecting a second portion of the surface of the monolithic semiconducting substrate. An insulator precursor species is implanted beneath the surface of the recessed first portion of the monolithic semiconducting substrate, and a trench is etched around the implanted and recessed first portion of the monolithic semiconducting substrate. The insulator precursor species is activated to form an insulator layer beneath the surface of the recessed first portion of the monolithic semiconducting substrate. The semiconductor on insulator structure is formed in the first portion of the monolithic semiconducting substrate, and the bulk semiconductor structure is formed in the second portion of the monolithic semiconducting substrate.

10 Claims, 3 Drawing Sheets

US 6,613,639 B1

FORMING A SEMICONDUCTOR ON IMPLANTED INSULATOR

FIELD

This invention relates to the field of integrated circuit fabrication. More particularly, this invention relates to a planarized semiconductor on insulator structure that has a reduced number and severity of crystal dislocations.

BACKGROUND

Semiconductor on insulator is a technology that is used to enhance the performance of integrated circuits. The technology involves forming a relatively thin layer of a semiconducting material, such as silicon, over a layer of an insulating material, such as an oxide or nitride of the semiconducting material, like silicon oxide. Semiconductor on insulator integrated circuits tend to operate more reliably at faster speeds and at lower powers than do bulk semiconductor devices. One reason for this performance enhancement is that semiconductor on insulator integrated circuits tend to have relatively lower junction capacitances.

One method of forming semiconductor on insulator integrated circuits is called separation by ion implantation of oxygen, which is commonly referred to as SIMOX. In this method, oxygen is implanted at a certain target depth beneath the surface of a semiconducting substrate, such as a silicon substrate. The implanted substrate is then thermally processed to stimulate a reaction between the semiconductor and the oxygen atoms, producing an oxide layer that acts as an electrically insulating layer below a relatively thin overlying layer of the semiconducting material.

There are often incentives for combining semiconductor on insulator structures in the same monolithic integrated circuit with bulk semiconductor structures. For example, a given integrated circuit may have need for both the relatively faster and lower power semiconductor on insulator structures and the higher power handling bulk semiconductor structures.

Unfortunately, SIMOX tends to best produce structures where the entire surface of a substrate has been processed. In other words, the insulation layer precursor material is implanted across the entire surface of the substrate, and the insulation layer is formed beneath all portions of the surface of the substrate.

What is needed therefore is a method for producing a semiconductor on insulator structure in the same monolithic integrated circuit with a bulk semiconductor structure.

SUMMARY

The above and other needs are met by a method of forming a semiconductor on insulator structure in a monolithic semiconducting substrate with a bulk semiconductor structure. A first portion of a surface of the monolithic semiconducting substrate is recessed without effecting a second portion of the surface of the monolithic semiconducting substrate. An insulator precursor species is implanted beneath the surface of the recessed first portion of the monolithic semiconducting substrate, and a trench is etched around the implanted and recessed first portion of the monolithic semiconducting substrate. The insulator precursor species is activated to form an insulator layer beneath the surface of the recessed first portion of the monolithic semiconducting substrate. The semiconductor on insulator structure is formed in the first portion of the monolithic semiconducting substrate, and the bulk semiconductor structure is formed in the second portion of the monolithic semiconducting substrate.

In this manner, both bulk structures and semiconductor on insulator structures are formed in the same monolithic substrate. By recessing the first portion prior to the activation and growth of the insulating layer, the surface of the first portion of the substrate is preferably substantially coplanar with the surface of the second portion of the substrate. Further, by also forming a trench around the implanted and recessed first portion of the substrate prior to the activation and growth of the insulating layer, the substrate tends to not suffer crystal dislocation damage as the insulating layer grows.

In various preferred embodiments of the invention the step of recessing the first portion of the surface of the substrate is accomplished by growing a thermal oxide layer on the surface of the substrate, and then depositing a nitride masking layer on the thermal oxide layer. A patterning layer is formed on the nitride masking layer, and openings are formed in the patterning layer. Portions of the nitride masking layer and the thermal oxide layer are etched through the openings in the patterning layer. The patterning layer is removed, and the first portion of the surface of the substrate underlying the etched portions of the nitride masking layer and thermal oxide layer are recessed. All material remaining on the surface of the substrate is stripped off.

In further preferred embodiments, the step of recessing the first portion of the surface of the substrate is accomplished by oxidizing the first portion of the surface of the substrate underlying the etched, portions of the nitride masking layer and the thermal oxide layer to partially consume the substrate. Most preferably the oxidizing step forms an oxide layer of between about one hundred nanometers and about one thousand nanometers in thickness. In alternate embodiments the step of recessing the first portion of the surface of the substrate is accomplished by one or more of etching the first portion of the surface of the substrate with an etching solution or a dry etch.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
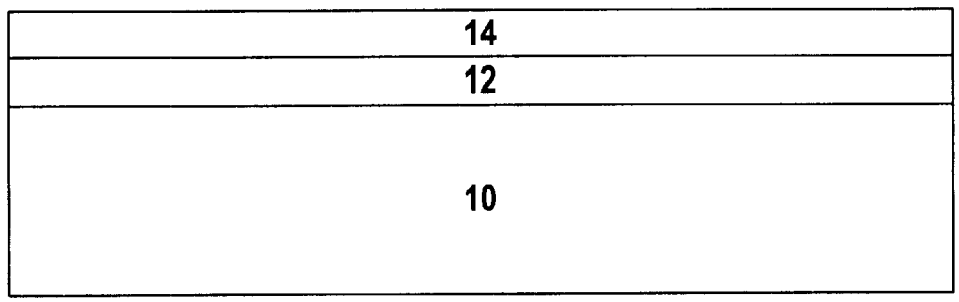
FIG. 1 is a cross sectional view of a substrate with masking layers.

Referring now to FIG. 1 there is depicted a substrate 10, preferably formed of a semiconducting material such as, silicon, but which may also be formed of germanium or a II–V compound such as gallium arsenide. The substrate 10 is most preferably a monolithic substrate, meaning that it is formed of a single piece of material, and that the structures to be formed as described in more detail below are all formed within and upon the single piece of material. Overlying the substrate 10 are preferably a protective layer 12, such as a thermal silicon oxide, and a masking layer 14, such as silicon nitride. It is appreciated that layer 12 and layer 14 may be formed of other materials, as such are consistent with the processing, materials, and structures as described herein.

Figure 2:
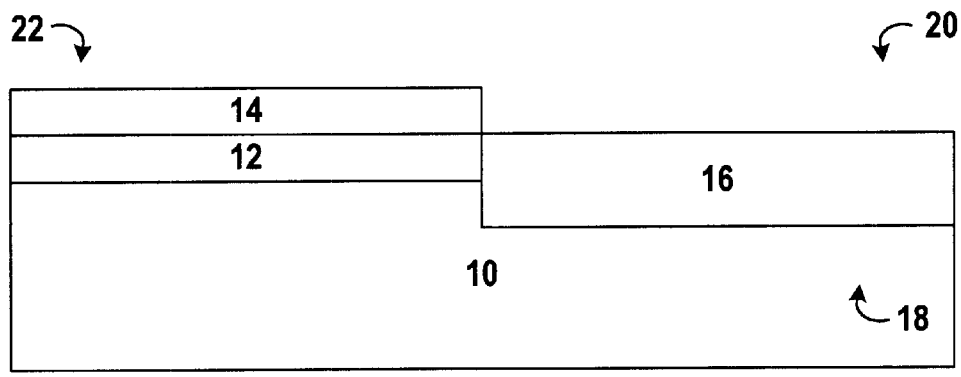
FIG. 2 is a cross sectional view of the substrate of FIG. 1, after patterning and formation of a structure that recesses the surface of the substrate at least in part.

With reference now to FIG. 2 there is depicted the substrate 10 of FIG. 1, after the substrate 10 has received additional processing. The protective layer 12 and the masking layer 14 have been partially etched, such as by overlying them with a patterning layer, such as photoresist, and removing portions of the layers by wet or dry etching down to the surface of a portion of the substrate 10. The portion of the surface of the substrate 10 which is thus exposed is generally referred to as the first portion 20 herein, while the portion of the surface of the substrate 10 which underlies the remaining protective layer 12 and masking layer 14 is generally referred to as the second portion 22 herein.

The first portion 20 of the surface of the substrate 10 is preferred recessed, to produce a recess 18. The recessing of the first portion 20 of the surface of the substrate 10 may be accomplished such as by a wet or dry etch, but is more preferably accomplished by reacting the surface of the substrate 10 with an agent that produces a layer 16, which consumes the material of the substrate 10 as the layer 16 forms. For example, in the specific case where the substrate 10 is formed of silicon, the first portion 20 of the surface of the substrate 10 is preferably reacted with an oxygen bearing agent under conditions sufficient to oxidize the silicon of the substrate 10 and produce a silicon oxide layer 16. This reaction tends to consume the silicon of the substrate 10 as it proceeds, thus forming a recess 18 in the silicon of the substrate 10 which underlies the layer 16. The layer 16 is preferably formed to a thickness of between about one hundred nanometers and about one thousand nanometers.

Recessing the first portion 20 of the surface of the substrate 10 with an oxidation of silicon is most preferred, because the process can be accomplished simultaneously with processing that is already a part of standard silicon integrated circuit fabrication techniques and processing flows, such as a part of a localized oxidation of silicon process, or LOCOS process, in which isolation structures are formed in the silicon substrate 10. Thus, this method of producing a recess 18 in the first portion 20 of the surface of the substrate 10 preferably does not require any additional steps in the process flow of an integrated circuit design that includes LOCOS processing.

It is appreciated that the figures may not depict the topography of the structures as they would exactly appear in actual cross sectional photographs of the structures. However, the figures depict representational topographies and shapes in a manner which makes the invention more easily understood, while still retaining the basic topographies and shapes of the structures as they might actually appear. Thus, ease in understanding the invention is facilitated without any significant loss in accuracy of the representations.

Figure 3:
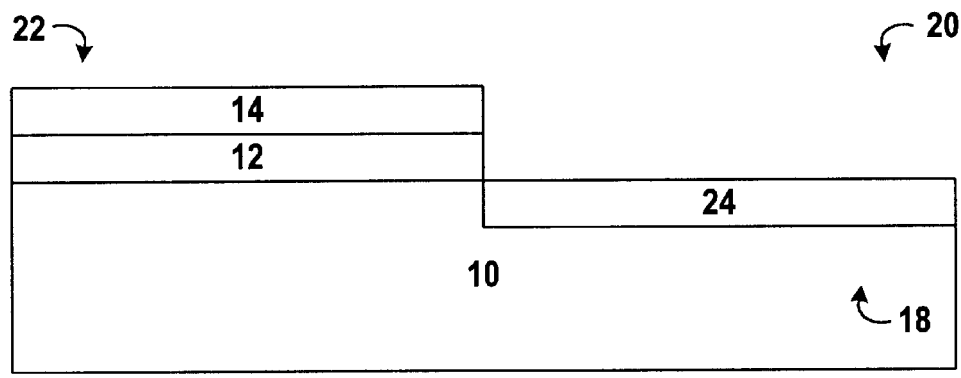
FIG. 3 is a cross sectional view of the substrate of FIG. 2, after the recessing structure has been removed and a protective layer has been formed.
Figure 4:
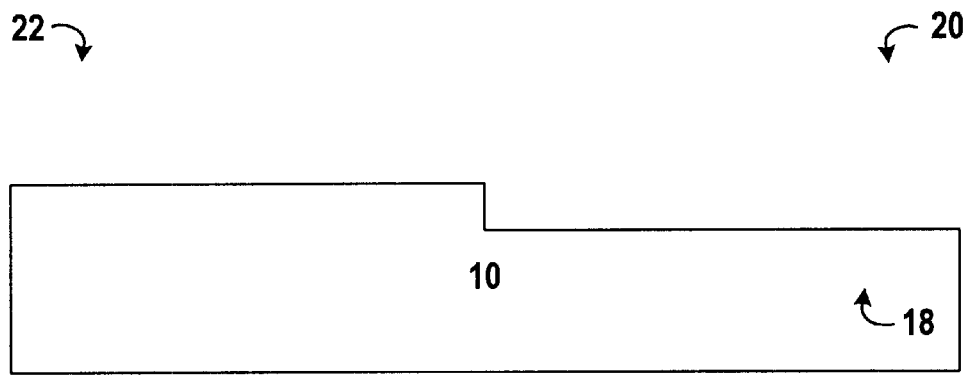
FIG. 4 is a cross sectional view of the substrate of FIG. 3, after all layers have been removed from the surface of the substrate.

In the structure as depicted in FIG. 3, the layer 16 has been removed, such as by a wet etch, and a layer 24 has been formed, such as an oxide layer with a thickness of from about fifty nanometers to about one hundred and fifty nanometers. In the preferred embodiment, the function of the layer 24 is to protect the silicon substrate 10 while the nitride masking layer 14 is removed. Once the nitride masking layer 14 is removed, both the protective layer 12 and the layer 24, which also functions as a protective layer, are preferably removed from the surfaces of the substrate 10, yielding the configuration as depicted in FIG. 4. It is appreciated that with other substrate 10 materials and masking layer 24 materials, that other protective layers 12 and 24 materials may also be selected, or may not even be required.

As depicted in FIG. 4, all materials have preferably been removed from the surfaces of the substrate 10, both from the first portion 20 of the surface of the substrate 10, and also from the second portion 22 of the surface of the substrate 10. As depicted in FIG. 4, the recess 18 that is formed in the first portion 20 of the surface of the substrate 10 is readily seen. The depth of the recess 18 from the level of the surface of the substrate 10 in the second portion 22 of the substrate 10 is preferably determined based at least in part on criteria that are given hereafter. If, based upon these criteria no recess is desired, then the foregoing steps may be omitted from the process.

Figure 5:
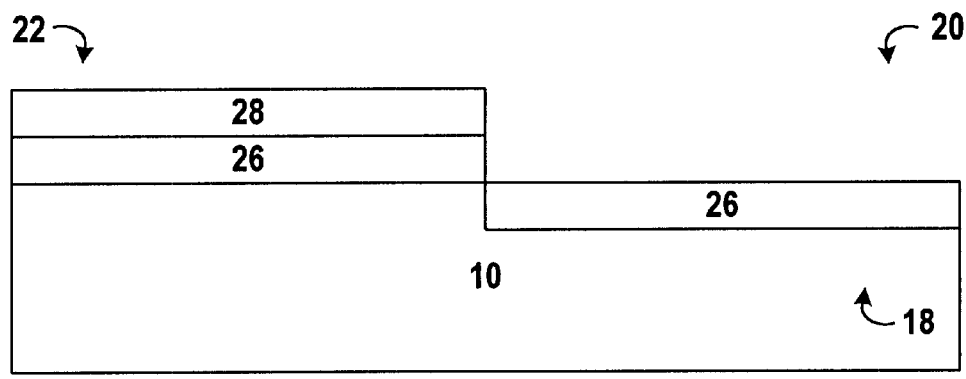
FIG. 5 is a cross sectional view of the substrate of FIG. 4 with an implant surface protection layer and a masking layer.

A surface protection layer 26 is preferably formed on the surfaces of the substrate 10, as depicted in FIG. 5. The surface protection layer 26 is most preferably formed of silicon oxide having a thickness of between about one hundred nanometers and about three hundred nanometers. The function of the surface protection layer 26 is to provide protection to the surface of the substrate 10 within the first portion 20 of the substrate 10, during an ion implantation process that is subsequently conducted and described hereafter. Thus, the exact composition and thickness of the surface protection layer 26 is dependent at least in part upon the process used for the ion implantation, which is selected based upon some of the criteria as described hereafter. In some embodiments, the ion implantation process may not require any surface protection layer 26 whatsoever, and thus the formation of the surface protection layer 26 may be omitted from the process.

A masking layer 28 is preferably formed on top of the surface protection layer 26 in the region of the second portion 22 of the surface of the substrate 10. The masking layer 28 provides a mask for the subsequent ion implantation process, and thus is preferably formed of a material and at a thickness that is sufficient to prohibit a substantial degree of ion implantation into the second portion 22 of the surface of the substrate 10. For example, the masking layer 28 may be formed of either nitride or aluminum, or another material with similar ion resistance properties. Most preferably the masking layer 28 is formed at a thickness of between about three hundred nanometers to about seven hundred nanometers. In one alternate embodiment, the ions to be implanted within the first portion 20 of the surface of the substrate 10 are written directly onto the substrate 10 using electronic controls that direct where the implantation will occur and where the implantation will not occur, and thus a masking layer 28 is not required.

Figure 6:
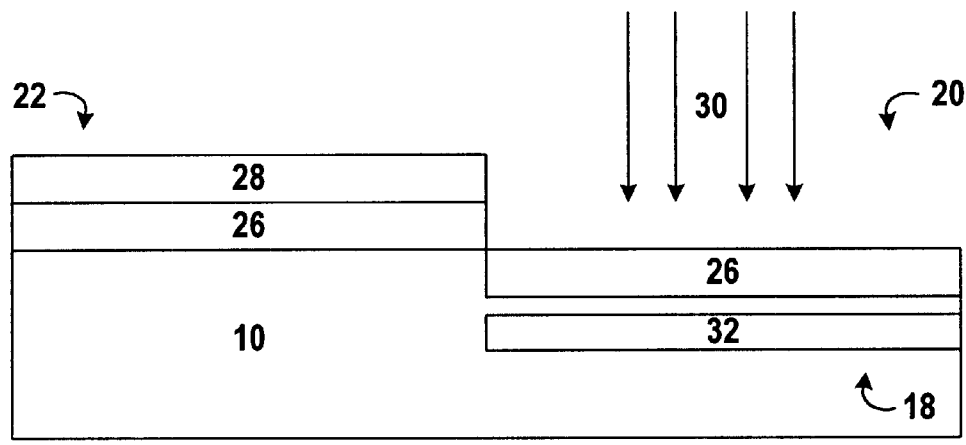
FIG. 6 is a cross sectional view of the substrate of FIG. 5, after implantation of a precursor species into a portion of the substrate.

As depicted in FIG. 6, an insulation precursor species 30 is implanted into the first portion 20 of the surface of the substrate 10 at a desired depth. The desired depth is preferable selected based at least in part upon criteria as given hereafter. The implanted insulation precursor species 30 form the beginnings of an insulation layer 32. It is appreciated the term "insulation layer" as used herein is meant to imply a layer that is non electrically conducting. In a most preferred embodiment, the precursor species 30 is oxygen, such as will form a non electrically conductive oxide with the material of the substrate 10. In the most preferred embodiment, this oxide is silicon oxide. In alternate embodiment, the precursor species 30 is nitrogen, which forms a non electrically conductive nitride with the material of the substrate 10.

Figure 7:
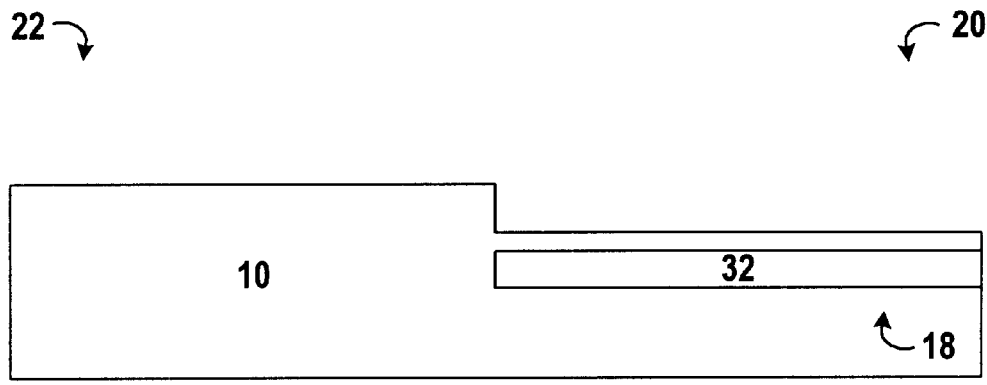
FIG. 7 is a cross sectional view of the substrate of FIG. 6, after all layers have been removed from the surface of the substrate.

FIG. 7 depicts the substrate 10 at a point at which the implantation is complete, and the surface protection layer 26 and the masking layer 28, if the two layers are used in the specific embodiment, have been removed. Thus, the insulation layer 32 is deposited within the first portion 20 of the substrate 10, while preferably none of the precursor species 30 is deposited in the second portion 22 of the substrate 10. At this point in the processing, preferably all of the materials that may have remained on the surfaces of the substrate 10 have been stripped off.

Figure 8:
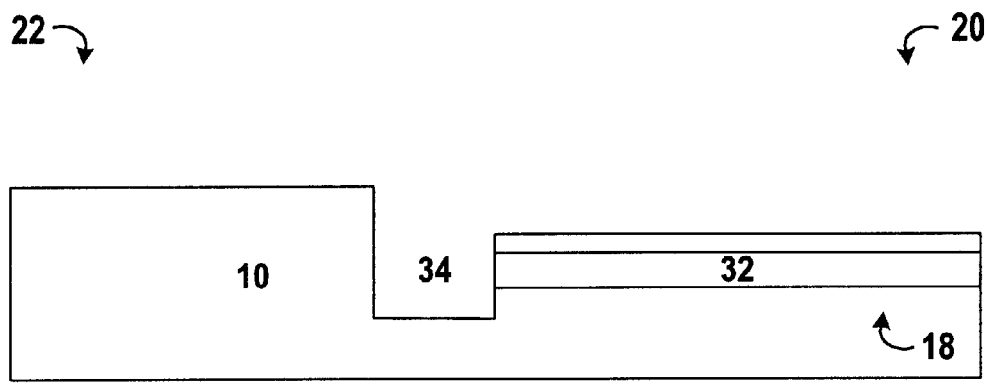
FIG. 8 is a cross sectional view of the substrate of FIG. 7, after formation of a trench around the implanted portion of the substrate.

A trench 34 is preferably formed around the circumference of the first portion 20 of the substrate 10, as depicted in FIG. 8. The trench 34 is preferably formed to a depth that extends further in to the substrate 10 than does the lowest edge of the insulating layer 32. Preferably, this depth is between about two hundred nanometers and about five hundred nanometers. The width of the trench 34 is preferably selected based at least in part upon the constraints of the process used to form the trench 34. Thus, if the trench 34 is wet etched, the trench 34 will tend to be somewhat wider than it would be if the trench 34 were formed with a dry etch process.

The width of the trench 34 may also be based in part upon alternate functions for the trench 34, other than those as described below. For example, if the trench 34 is to also serve as an isolation structure, then the properties of the structures to be formed on either side of the trench 34 are preferably included in the criteria used to determine the width of the trench 34.

Figure 9:
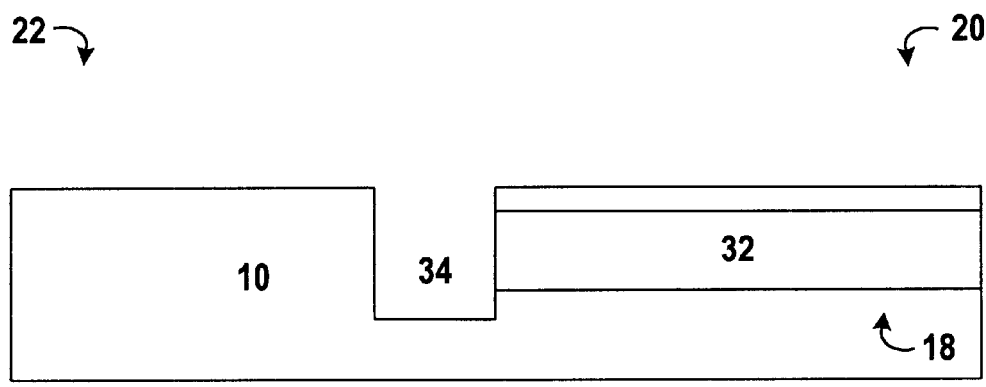
FIG. 9 is a cross sectional view of the substrate of FIG. 8, after formation of the insulation layer, showing the substantially coplanar surfaces of the bulk semiconductor portion and the semiconductor on insulator portion of the monolithic integrated circuit.

As depicted in FIG. 9, the insulation layer 32 is preferably activated, such as by thermal processing, which causes the material of the insulation precursor species that was implanted into the insulation layer 32 to react with the material of the substrate 10 and more completely form the insulation layer 32. As depicted in FIG. 9, in the preferred embodiment in which the implanted species is oxygen and the substrate 10 is formed of silicon, the insulation layer 32 forms a silicon oxide upon activation. The silicon oxide insulation layer 32 tends to require more room than does the unreacted oxygen within the silicon substrate 10. Thus, as the insulation 10 is activated, the surface of the substrate 10 within the first portion 20 of the substrate 10 tends to be elevated, most preferably to substantially about the same level as that of the surface of the substrate 10 in the second portion 22 of the substrate 10.

In this manner, there is formed a semiconductor on insulator structure within the first portion 20 of the substrate 10, and a bulk semiconductor structure within the second portion 22 of the substrate 10. In addition, the surface within the first portion 20 and the second portion 22 are preferably disposed substantially within the same plane as one another, or in other words, are at about the same height. Thus, subsequent structures that are formed in the first portion 20 and the second portion 22 are also at substantially the same height, which tends to simplify subsequent processing. Further, because the trench 34 tends to physically disconnect upper portions of the first portion 20 from the second portion 22, any dislocations that may tend to form in crystal structures between the bulk structure in the second portion 22: of the substrate 10 and the semiconductor on insulator structure in the first portion 20 of the substrate 10 are substantially avoided.

If it is not important that the surface of the substrate 10 within the first portion 20 of the substrate 10 be at substantially the same level as the surface of the substrate 10 within the second portion 22 of the substrate 10, then the procedures described above in regard to forming the recess 18 within the first portion 20 of the substrate 10 may be omitted. Further, the depth of the recess 18 that is formed may be adjusted based upon a desired final elevation of the surface of the substrate 10 within the first portion 20 of the substrate 10, whether that final elevation be either below or above the level of the surface of the substrate 10 within the second portion 22 of the substrate 10.

Thus, recessing may be performed at a greater degree, a lesser degree, or omitted altogether, based at least in part upon the desired level of planarity between the surfaces of the substrate 10 within the first portion 20 and the second portion 22. Further, the amount of precursor material 30 that is implanted within the first portion 20 also preferably has an effect on how far the surface of the first portion 20 is elevated during activation of the insulation layer 32. For example, a greater implanted dose of the precursor species 30 tends to raise the surface of the first portion 20 to a greater degree, and a lesser implanted dose of the precursor species 30 tends to raise the surface of the first portion 20 to a lesser degree.

The trench 34 is preferably filled with a non electrically conducting material, and additional structures are formed within the bulk semiconductor second portion 22 and the semiconductor on insulator first portion 20 of the substrate 10. The integrated circuits so formed are distinguishable from those fabricated by other processes by the circumferential trenches 34 that ring the semiconductor on insulator first portions 20 of the substrate 10.

The foregoing embodiments of this invention have been presented for purposes of illustration and description. They are not intended to be exhaustive or to limit the invention to the precise form disclosed. Obvious modifications or variations are possible in light of the above teachings. The embodiments are chosen and described in an effort to provide illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A method of forming a semiconductor on insulator structure in a monolithic semiconducting substrate with a bulk semiconductor structure, the method comprising the steps of:

recessing a first portion of a surface of the monolithic semiconducting substrate without effecting a second portion of the surface of the monolithic semiconducting substrate, by growing a thermal oxide layer on the surface of the substrate, depositing a nitride masking layer on the thermal oxide layer, forming a patterning layer on the nitride masking layer, forming openings in the patterning layer, etching portions of the nitride masking layer and the thermal oxide layer through the openings in the patterning layer, removing the patterning layer, recessing the first portion of the surface of the substrate underlying the etched portions of the nitride masking layer and the thermal oxide layer, and stripping off all material remaining on the surface of the substrate, implanting an insulator precursor species of one of oxygen and nitrogen beneath the surface of the recessed first portion of the monolithic semiconducting substrate, etching a trench around the implanted and recessed first portion of the monolithic semiconducting substrate, activating the insulator precursor species to form an insulator layer beneath the surface of the recessed first portion of the monolithic semiconducting substrate, thereby elevating the surface of the recessed first portion of the substrate to be substantially planar with the second portion of the surface of the substrate, forming the semiconductor on insulator structure in the first portion of the monolithic semiconducting substrate, and forming the bulk semiconductor structure in the second portion of the monolithic semiconducting substrate.

2. The method of claim 1, wherein the step of recessing the first portion of the surface of the substrate underlying the etched portions of the nitride masking layer and the thermal oxide layer comprises the step of:

oxidizing the first portion of the surface of the substrate underlying the etched portions of the nitride masking layer and the thermal oxide layer to partially consume the substrate.

3. The method of claim 2, wherein the step of oxidizing the first portion of the surface of the substrate forms an oxide layer of between about one hundred nanometers and about one thousand nanometers in thickness.

4. The method of claim 1, wherein the step of recessing the first portion of the surface of the substrate underlying the etched portions of the nitride masking layer and the thermal oxide layer comprises the step of:

etching the first portion of the surface of the substrate with an etching solution.

5. The method of claim 1, wherein the step of recessing the first portion of the surface of the substrate underlying the etched portions of the nitride masking layer and the thermal oxide layer comprises the step of:

etching the first portion of the surface of the substrate with a dry etch.

6. A method of forming an insulating layer below a semiconducting layer in a semiconducting substrate, the method comprising the steps of:

recessing a first portion of a surface of the substrate without effecting a second portion of the surface of the substrate, by growing a thermal oxide layer on the surface of the substrate, depositing a nitride masking layer on the thermal oxide layer, forming a patterning layer on the nitride masking layer, forming openings in the patterning layer, etching portions of the nitride masking layer and the thermal oxide layer through the openings in the patterning layer, removing the patterning layer, recessing the first portion of the surface of the substrate underlying the etched portions of the nitride masking layer and the thermal oxide layer, and stripping off all material remaining on the surface of the substrate, implanting an insulator precursor species of one of oxygen and nitrogen beneath the surface of the recessed first portion of the semiconducting substrate, etching a trench around the implanted and recessed first portion of the semiconducting substrate, and activating the insulator precursor species to form an insulator layer beneath the surface of the recessed first portion of the semiconducting substrate, thereby elevating the surface of the recessed first portion of the substrate to be substantially planar with the second portion of the surface of the substrate.

7. The method of claim 6, wherein the step of recessing the first portion of the surface of the substrate underlying the etched portions of the nitride masking layer and the thermal oxide layer comprises the step of:

oxidizing the first portion of the surface of the substrate underlying the etched portions of the nitride masking layer and the thermal oxide layer to partially consume the substrate.

8. The method of claim 7, wherein the step of oxidizing the first portion of the surface of the substrate forms an oxide layer of between about one hundred nanometers and about one thousand nanometers in thickness.

9. The method of claim 6, wherein the step of recessing the first portion of the surface of the substrate underlying the etched portions of the nitride masking layer and the thermal oxide layer comprises the step of:

etching the first portion of the surface of the substrate with an etching solution.

10. The method of claim 6, wherein the step of recessing the first portion of the surface of the substrate underlying the etched portions of the nitride masking layer and the thermal oxide layer comprises the step of:

etching the first portion of the surface of the substrate with a dry etch.

* * * * *